(12) United States Patent
Dufrêne et al.

(10) Patent No.: US 9,002,310 B2
(45) Date of Patent: Apr. 7, 2015

(54) IP2 CALIBRATION METHODS AND TECHNIQUES

(75) Inventors: Krzysztof Dufrêne, Plesching (AT); Harald Froehlich, Vorderweissenbach (AT)

(73) Assignee: Intel Mobile Communications GmbH, Neubiberg (DE)

( * ) Notice: Subject to any disclaimer, the term of this patent is extended or adjusted under 35 U.S.C. 154(b) by 1181 days.

(21) Appl. No.: 12/892,010

(22) Filed: Sep. 28, 2010

(65) Prior Publication Data

US 2012/0077452 A1 Mar. 29, 2012

(51) Int. Cl.
| H04B 1/10 | (2006.01) |
| H04B 1/30 | (2006.01) |
| H03D 7/16 | (2006.01) |
| H04L 27/00 | (2006.01) |

(52) U.S. Cl.
CPC ............. *H04B 1/30* (2013.01); *H03D 7/165* (2013.01); *H03D 2200/0088* (2013.01); *H04B 1/109* (2013.01); *H04L 27/0014* (2013.01)

(58) Field of Classification Search
CPC ............................ H04B 1/709; H04L 27/2647
USPC ............... 455/63.1, 67.11, 67.14, 226.1, 283, 455/284, 285, 295, 296; 375/343
See application file for complete search history.

(56) References Cited

U.S. PATENT DOCUMENTS

| 5,749,051 | A * | 5/1998 | Dent | 455/324 |
| 2002/0181611 | A1 * | 12/2002 | Kim | 375/296 |
| 2003/0022646 | A1 * | 1/2003 | Bult et al. | 455/232.1 |
| 2006/0274822 | A1 * | 12/2006 | Stahlberg et al. | 375/150 |
| 2007/0077908 | A1 * | 4/2007 | Vorenkamp et al. | 455/323 |
| 2008/0039045 | A1 * | 2/2008 | Filipovic et al. | 455/295 |
| 2009/0088120 | A1 * | 4/2009 | Ling et al. | 455/314 |
| 2009/0181633 | A1 * | 7/2009 | Molnar et al. | 455/317 |
| 2009/0186587 | A1 * | 7/2009 | Sobchak et al. | 455/196.1 |
| 2010/0093298 | A1 * | 4/2010 | Pratt et al. | 455/226.1 |

OTHER PUBLICATIONS

Krzysztof Dufrêne, et al. A 0.13 μm 1.5 V CMOS I/Q Downconverter with Digital Adaptive IIP2 Calibration. 2007 IEEE International Solid-State Circuits Conference. 3 Pages.
Krzysztof Dufrêne, et al. Adaptive IP2 Calibration Scheme for Direct-Conversion Receivers. Institute for Electronics Engineering, University of Erlangen-Nuremberg, Erlangen, Germany. 4 Pages.
Krzysztof Dufrêne, et al. Digital Adaptive IIP2 Calibration Scheme for CMOS Downconversion Mixers. IEEE Journal of Soild-State Circuits, vol. 43, No. 11, Nov. 2008. 12 Pages.

* cited by examiner

*Primary Examiner* — Yuwen Pan
*Assistant Examiner* — Ayodeji Ayotunde
(74) *Attorney, Agent, or Firm* — Eschweiler & Associates, LLC

(57) ABSTRACT

Some embodiments of the present disclosure relate to improved techniques for performing IP2 calibration in receivers having two complementary data paths (e.g., i-data path and q-data path). In these techniques, one of the two data paths (e.g., the i-data path) is used to generate a reference signal for the other data path (e.g., the q-data path), and/or vice versa. The other data path then performs calibration using the reference signal. Compared to previous techniques (which required separate, dedicated circuitry for generating a reference signal), the inventive techniques reduce the amount of circuitry and correspondingly reduce the manufacturing costs and power consumption. This is because the inventive techniques use the existing circuitry in complementary fashion during calibration (e.g., during calibration an i-data path generates a reference signal for a q-data path, and vice versa).

21 Claims, 5 Drawing Sheets

IP2 CALIBRATION METHODS AND TECHNIQUES

The present disclosure relates to wireless communication transceivers, and in particular to linearity improvement techniques for receiving high quality signals in the presence of strong interfering signals.

Among various linearity requirements, receivers are expected to possess high second-order intercept point (IP2), which characterizes second-order nonlinearity responsible for generation of second-order inter-modulation distortion (IMD2). Either compensation or calibration techniques can be used to improve the IP2 characteristics of receivers. Although calibration techniques possess certain advantages over compensation techniques, until now it has been difficult to provide optimal control signals (e.g., tuning codes) in a cost-effective and power-efficient manner. This is largely because previous implementations have required separate, dedicated circuitry for generating a reference signal used during calibration. Hence, the present disclosure provides IP2 calibration techniques that limit the amount of circuitry compared with conventional techniques, thereby tending to reduce manufacturing costs and power requirements.

DETAILED DESCRIPTION

Figure 1:
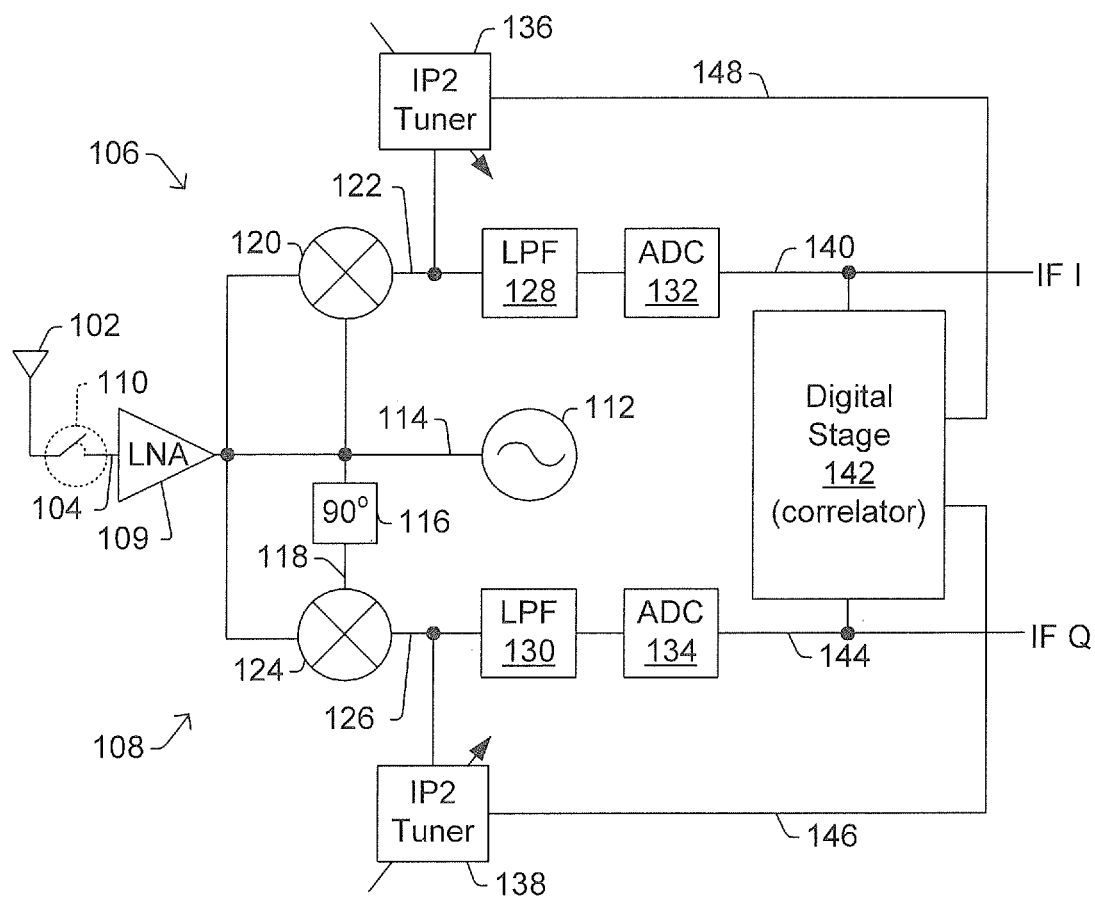
FIG. 1 is a block diagram illustrating a receiver in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Some embodiments of the present disclosure relate to improved techniques for performing IP2 calibration in receivers having two complementary data paths (e.g., i-data path and q-data path). In these techniques, one of the two data paths (e.g., the i-data path) is used to generate a reference signal for the other data path (e.g., the q-data path). The other data path then performs calibration using the reference signal. Compared to previous techniques (which required separate, dedicated circuitry for generating a reference signal), the inventive techniques reduce the amount of circuitry and correspondingly reduce the manufacturing costs and power consumption. This is because the inventive techniques use the existing circuitry in complementary fashion during calibration (e.g., during calibration an i-data path generates a reference signal for a q-data path, and vice versa).

FIG. 1 shows a receiver 100 in accordance with some embodiments. The receiver 100 includes a radio-frequency (RF) antenna 102 to receive an RF signal 104. An i-data path 106 and a q-data path 108 are coupled to the RF antenna 102, often being selectively coupled to the RF antenna 102 via a switching element 110, such as a band selecting switch element (usually merged with a prefilter) or a duplexer for example, and a low-noise amplifier (LNA) 109. During normal data reception, a local oscillator (LO) block 112 provides an LO signal 114, and a phase shift element 116 shifts the phase of the LO signal to provide a phase shifted LO signal 118, which is 90° phase shifted with respect to the LO signal 114. On the i-data path 106, a first mixer 120 provides an i-data signal 122 by mixing the RF signal 104 with the LO signal 114. On the q-data path 108, a second mixer 124 provides a q-data signal 126 by mixing the RF signal 104 with the phase-shifted LO signal 118. The i-data and q-data signals 122, 126 are filtered (by filters 128, 130, respectively) and digitized (by analog-to-digital converters 132, 134, respectively) so they can be suitably processed by a digital stage 142. The digital stage 142 can include a baseband processor and/or other logic to process the digitized data according to one or more functions (e.g., de-interleaving, descrambling, and/or decoding) so data encoded in the received RF signal 104 can be presented to a user via a user interface (not shown).

To limit the effects of noise and increase the effective IP2 of the receiver 100, the receiver 100 can carry out calibration through the use of two IP2 tuning circuits 136, 138. During calibration one of the IP2 tuning circuits (e.g., the first IP2 tuning circuit 136) selectively distorts data on its data path (e.g., i-data path 106) while the other IP2 tuning circuit (e.g., second IP2 tuning circuit 138) determines a corresponding calibration value on its data path (e.g., q-data path 108). Calibration values are obtained for the i-data and q-data paths for each of a number of wanted frequencies over which the receiver receives data during normal operation. After calibration is done, the calibration values can subsequently be used to pre-distort data on the i-data and q-data paths 106, 108 to compensate for expected distortion on the frequency channels during normal data reception. Calibration can be carried out at a fabrication/assembly facility prior to distribution to a customer and/or can be carried out periodically after the customer has used the receiver, depending on the implementation. In some implementations, the calibration can be carried out while a customer is actually receiving data, such that reception performance is deliberately deteriorated for some short time interval in order to update calibration codes with the merit of better performance throughout the rest of operation by the customer.

For example, during a first time period in which the second IP2 tuner 138 inserts little or no distortion onto the q-data path 108, the first ip2 tuning circuit 136 can significantly distort the i-data signal 122, for example by inserting some additional current or voltage onto the i-data signal 122, thereby providing a first reference signal on path 122 during the first time. The first reference signal 122 is filtered by low pass filter (LPF) 128, after which the ADC 132 converts the filtered signal into a digitized reference signal 140. During the first time period, a correlation element 142 correlates the digitized first reference signal 140 with a digitized q-data signal 144 to generate a first correlation result. The first correlation result is provided to the second ip2 tuning circuit 138 via path 146, causing the second ip2 tuning circuit 138 to introduce distortion on the q-data path 108 during the first time period according to the first q-data calibration value. At some time, the first correlation result 146 settles (or a predetermined time elapses), after which the first q-data calibration value is stored for later use. In some embodiments, the first correlation result 146 is an N-bit tuning code, wherein N can be greater than or equal to 1.

In the same regard, during a second, different time period in which little or no distortion is inserted on the i-data path 106, the second ip2 tuning circuit 138 selectively introduces distortion on the q-data path 108, thereby providing a second reference signal on 136. The second reference signal 136 is filtered by low pass filter (LPF) 130, after which ADC 134 converts the filtered signal into a second reference signal 144. During the second time period, the correlation element 142 correlates the digitized second reference signal 144 with the digitized i-data signal on 140 to generate a second correlation result 148. The first ip2 tuning circuit 138 selectively introduces distortion on the i-data path 106 during the second time period according to a first i-data calibration value, which is based on the second correlation result 148. At some time, the second correlation result 148 settles (or a predetermined time elapses), after which the second q-data calibration value is stored for later use. In some embodiments, the second correlation result 148 is an N-bit tuning code, wherein N can be greater than or equal to 1.

Figure 2:
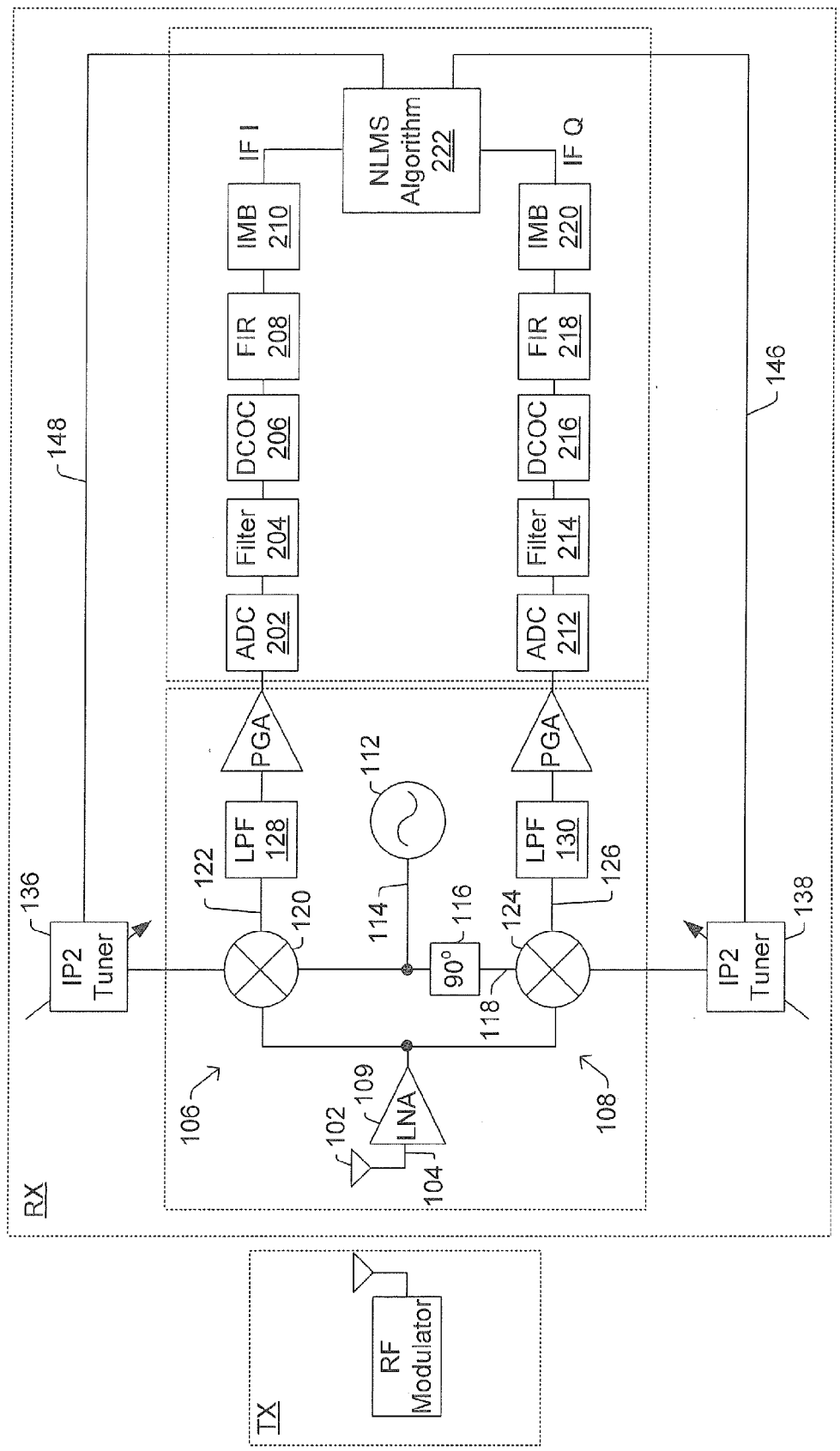
FIG. 2 illustrates a communication system including a receiver in accordance with another embodiment.
Figure 3:
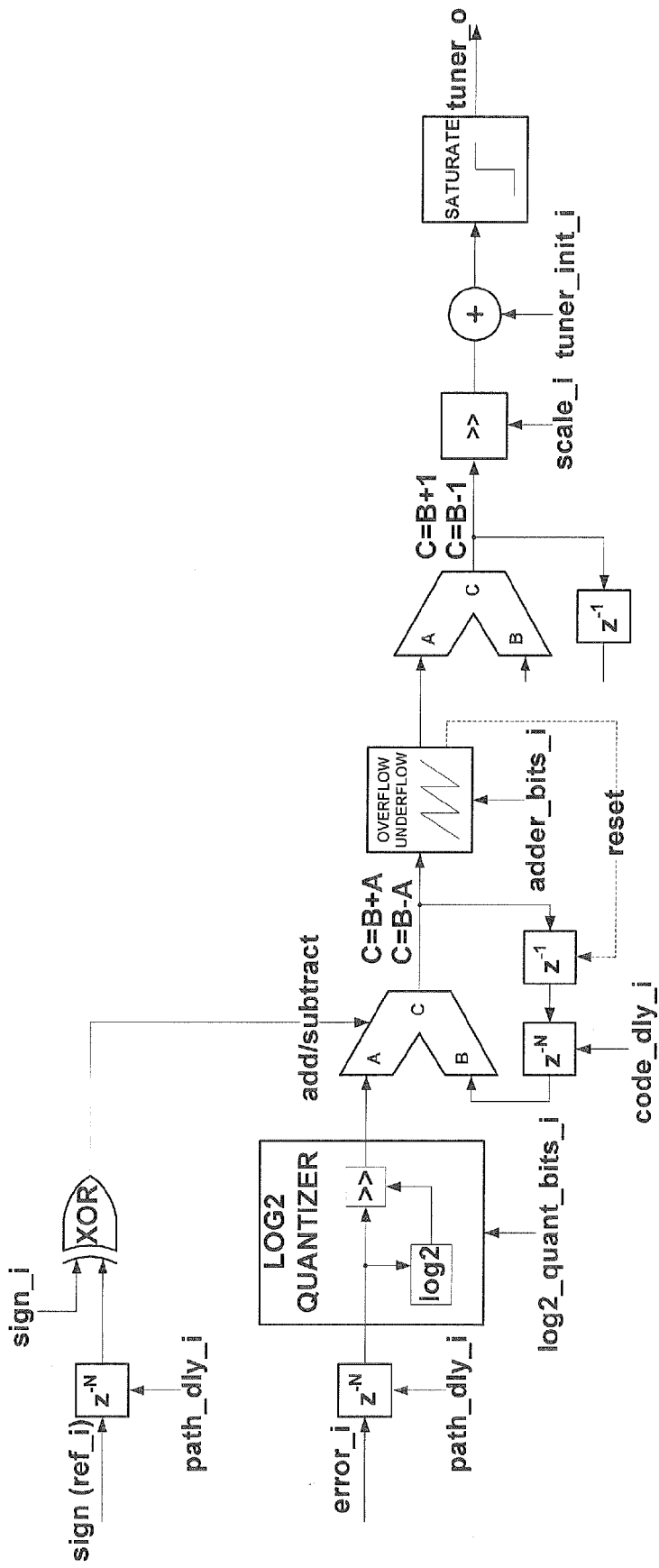
FIG. 3 is a correlation block for carrying out an NLMS algorithm in accordance with some embodiments.

FIG. 2 shows another embodiment wherein like elements are represented by like reference numerals. In addition to the elements described in FIG. 1, FIG. 2 shows another embodiment of a digital stage 200. On the i-data path 104, the digital stage includes ADC 202, a filter 204, a DC offset compensation block 206, a channel filter block 208, and an IQ-imbalance compensation block 210. On the q-data path 106, the digital stage includes ADC 212, a filter 214, a DC offset compensation block 216, a channel filter block 218, and an IQ-imbalance compensation block 220. A correlation element 222 in this embodiment is achieved by a Normalized Least Mean Squares (NLMS) algorithm, although other algorithms could also be used. FIG. 3 shows one manner in which the NLMS algorithm can be realized. It will be appreciated that, in general, the NLMS algorithm can be achieved in purely in dedicated hardware, purely in software, or using a combination of hardware and software. In essence, the NLMS algorithm compares the signal received from the i-data path with the signal received from the q-data path, and outputs a correlation value that corresponds to a difference between a desired signal and the actual signal on a path. Thus, for a given frequency and mode, the correlation value for a given path taken during calibration is indicative of expected distortion on that channel.

Figure 4:
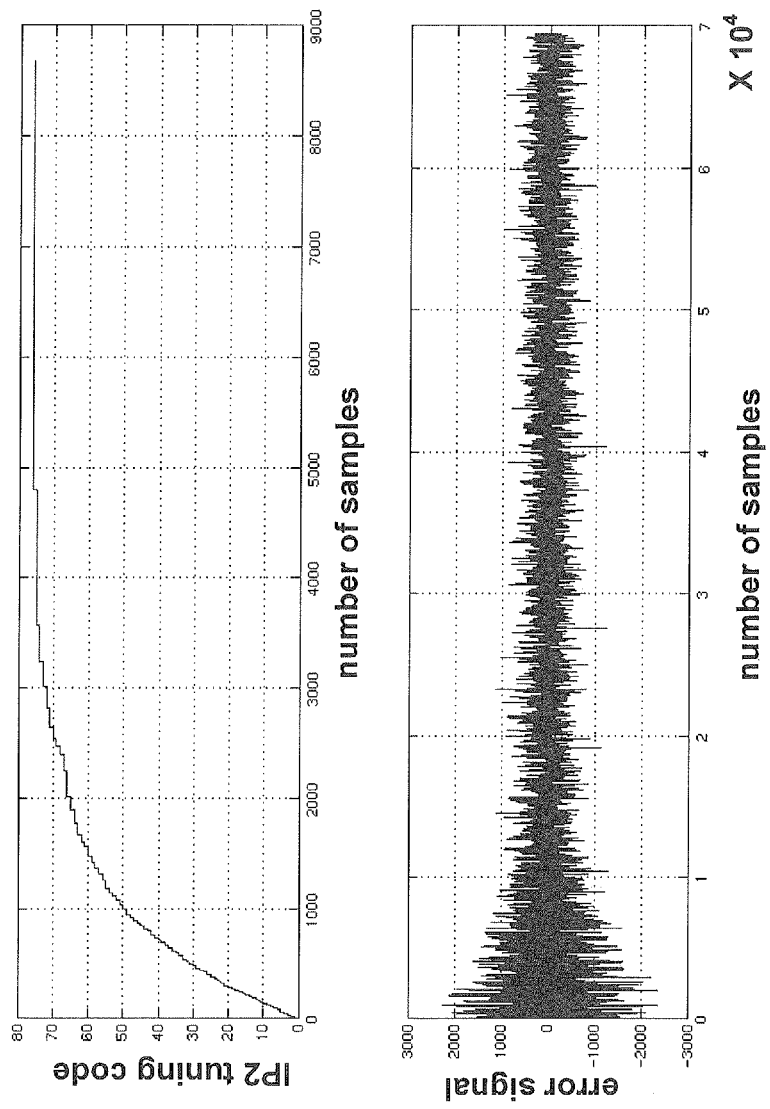
FIG. 4 shows a pair of simulated learning curves during which a calibration value is determined.

FIG. 4 illustrates simulated learning curves to obtain a calibration value for a data path during a first time. The mixer had an initial IP2 of +50 dBm. At the beginning of the simulation the error signal contains inter-modulation products plus noise. After convergence of the calibration only noise remains in the error signal. The error signal corresponds to the IP2 tuning code curve. After about 3500 samples the IP2 tuning code converges to the optimal value that limits distortion (e.g., to a minimum value). The used sample rate is 6.5 MHz, so the calibration takes about 450 μs.

Figure 5:
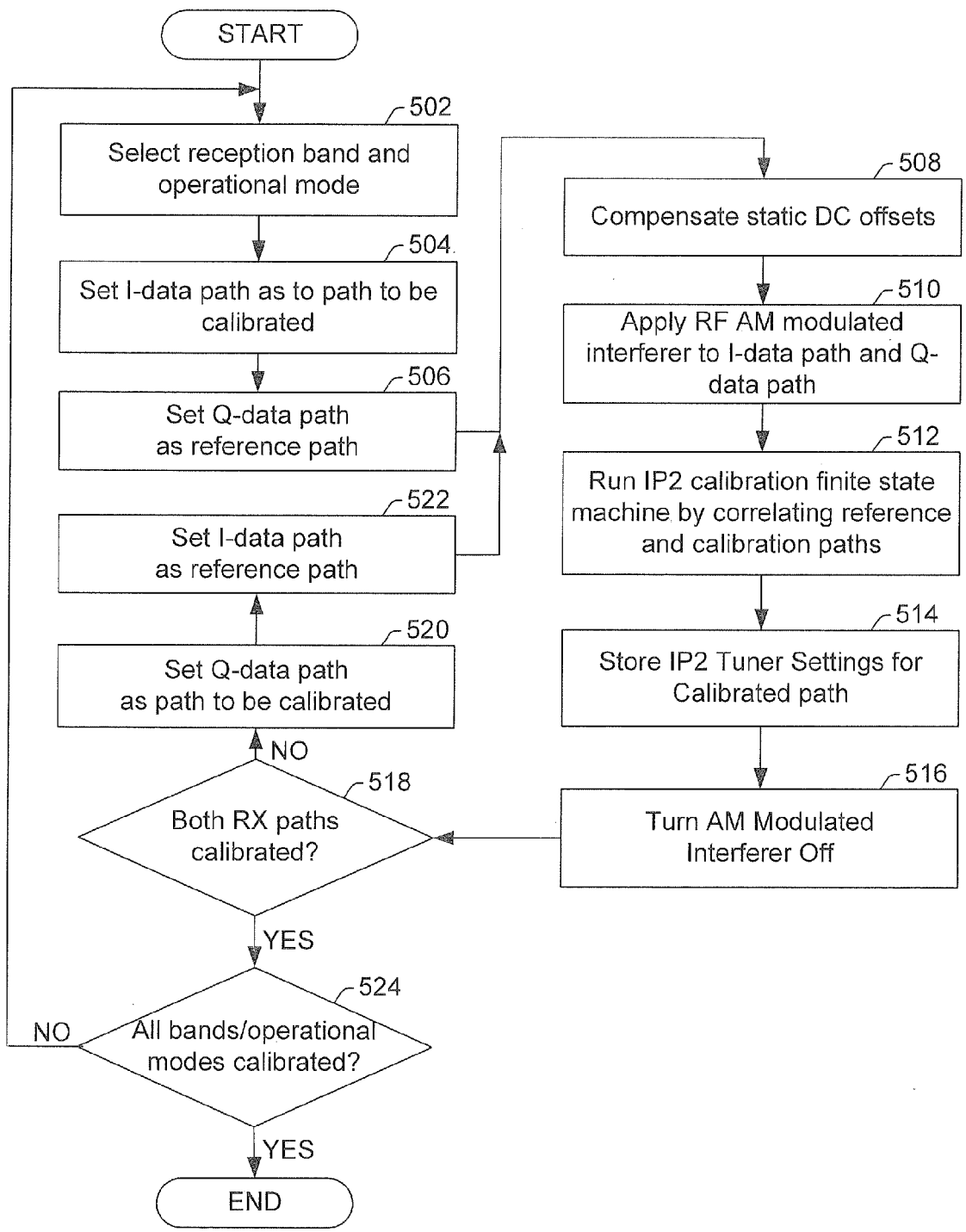
FIG. 5 is a flowchart in accordance with some embodiments.

A method 500 is illustrated and described below with respect to FIG. 5. While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 1-3 are non-limiting examples of circuits that may be used to implement method 500). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Method 500 starts at 502, when a reception frequency band and an operating mode are selected. In many embodiments, the reception frequency band is chosen from one of a number of frequency bands that can be used by the receiver.

At 504 an i-data path is set as the path to be calibrated, and in 506 the q-data path is set as the reference path. Often, setting a path as a reference path means setting the tuning code value for the path to some pre-determined, fixed value that is larger than a tuning code for the calibration path. In 508, the method compensates for static DC offsets on the i-data path and q-data path.

In 510, the method applies interference to both the reference path (e.g., the q-data path) and path to be calibrated (e.g., i-data path). In FIG. 5's example, the interference applied is an amplitude modulated (AM) RF interferer, although other types of interferers could also be applied. The interference is applied to both paths to see how much intrinsic distortion is generated. In some embodiments, the AM interferer can be an unwanted frequency component included in the RF signal received by the receiver's antenna (and which is subsequently filtered out by filters, e.g., LPFs 128, 130 in FIG. 1's receiver). In other embodiments, the AM interferer can be injected into the i-data and q-data paths at some other point in the receiver, such as on a third port of a switching element (e.g., switching element 110 in FIG. 1), or at some other point in the receiver. Whatever the case, the AM interferer exercises non-linearities in mixers in the i-data and q-data paths so that IP2 tuners can store calibration values to compensate for these non-linearities.

In 512, the method runs through an IP2 calibration finite state machine (FSM) by correlating the reference path and the calibration path.

In 514, the IP2 tuner settings are stored for the calibrated path for the reception frequency band, and the AM modulated RF interferer is then turned off in 516.

At 518, the method determines if both reception paths are calibrated for the selected reception frequency and operational mode. If not ('NO' at 518), the method sets the q-data path as the calibration path in 520 and sets the i-data path as the reference path in 522. The method then carries out blocks 508-516 again, but with the q-data path as the calibration path and the data path as the reference path.

At this point, both the i-data path and q-data path are calibrated for the selected reception band and selected operational mode, so the method proceeds to 524. If additional frequency bands and/or operational modes are to be characterized ('NO' at 524), the method 500 loops back through 502-522 until calibration values are determined for all bands and modes.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A calibration circuit, comprising:
   an in-phase receive data path;
   a quadrature receive data path;
   a correlation element to correlate received in-phase data from the in-phase receive data path with received quadrature data from the quadrature receive data path to obtain a correlation result;
   a first tuning circuit coupled between the correlation element and the in-phase receive data path and configured to receive the correlation result from the correlation element, wherein the first tuning circuit provides an in-phase receive data tuning signal that is based on the correlation result to compensate for distortion on the in-phase receive data path; and
   a second tuning circuit coupled between the correlation element and the quadrature receive data path, wherein the second tuning circuit provides a quadrature receive data tuning signal based on the correlation result to compensate for distortion on the quadrature receive data path.

2. The calibration circuit of claim 1, wherein the in-phase receive data tuning signal is an N-bit digital control word, wherein N is an integer greater than or equal to 1.

3. The calibration circuit of claim 1, wherein the first tuning circuit is configured to introduce continuous distortion onto the in-phase receive data path while the second tuning circuit adjusts the quadrature receive data tuning signal to find a calibrated quadrature value.

4. The calibration circuit of claim 3, wherein the second tuning circuit is configured to introduce continuous distortion onto the quadrature receive data path while the first tuning circuit adjusts the in-phase receive data tuning signal to find a calibrated in-phase value.

5. The calibration circuit of claim 4, wherein the first tuning circuit and the second tuning circuit find the calibrated quadrature value and the calibrated in-phase value, respectively, during calibration before the calibration circuit is provided to a user.

6. The calibration circuit of claim 4, wherein the first tuning circuit and the second tuning circuit find the calibrated quadrature value and the calibrated in-phase value, respectively, intermittently after the calibration circuit has been provided to a user.

7. A receiver, comprising:
   a radio-frequency (RF) antenna to receive an RF signal over a frequency channel;
   an in-phase receive data path and a quadrature receive data path coupled to the RF antenna, wherein the in-phase receive data path provides an in-phase received data signal by mixing the RF signal with an LO signal, and wherein the quadrature receive data path provides a quadrature received data signal by mixing the RF signal with a phase-shifted LO signal;
   a first tuning circuit to selectively introduce distortion on the in-phase receive data path, wherein the distortion distorts the received in-phase data signal during a first time period to provide a first reference signal;
   a correlation element to correlate the first reference signal with the quadrature received data signal during the first time period to generate a first correlation result; and
   a second tuning circuit configured to receive the first correlation result from the correlation element and to selectively introduce distortion on the quadrature receive data path during the first time period according to a quadrature received data calibration value, wherein the quadrature received data calibration value is based on the first correlation result.

8. The receiver of claim 7:
   wherein the second tuning circuit selectively introduces distortion on the quadrature receive data path during a second time period and thereby provides a second reference signal;
   wherein the correlation element correlates the second reference signal with the in-phase received data signal during the second time period to generate a second correlation result; and
   wherein the first tuning circuit selectively introduces distortion on the in-phase receive data path during the second time period according to an in-phase received data calibration value, wherein the in-phase received data calibration value is based on the second correlation result.

9. The receiver of claim 8, further comprising:
   a memory to store the in-phase received data calibration value and the quadrature received data calibration value; and
   a controller to provide the in-phase received data calibration value and the quadrature received data calibration value to the first tuning circuit and the second tuning circuit, respectively, during reception of data during a third time period to compensate for expected distortion of data during the third time period.

10. The receiver of claim 9, wherein the RF antenna receives an RF signal over a second, different frequency channel at a fourth time and determines additional calibration tuning values for the different frequency channel.

11. The receiver of claim 7, wherein the quadrature receive data tuning signal is an N-bit digital control word, wherein N is an integer greater than or equal to 1.

12. A calibration method, comprising:
    receiving an RF signal over a frequency channel;
    mixing the RF signal with an LO signal to provide an in-phase received data signal;
    mixing the RF signal with a phase-shifted LO signal to provide a quadrature received data signal;
    using a first amplitude modulated interference signal during a first time interval to distort the in-phase received data signal to provide a first reference signal, and to distort the quadrature received data signal to provide a first error signal;
    correlating the first reference signal with the first error signal to generate a first correlation result; and altering the quadrature receive data signal during the first time period according to a first calibration tuning value, wherein the first calibration tuning value is based on the first correlation result.

13. The method of claim 12, further comprising:
using a second amplitude modulated interference signal during a second time interval to distort the quadrature received data signal, thereby providing a second reference signal, and to distort the in-phase received data signal, thereby providing a second error signal;
correlating the second reference signal with the second error signal during the second time period to generate a second correlation result; and
altering the in-phase receive data path during the second time period according to a second calibration tuning value, wherein the second calibration tuning value is based on the second correlation result.

14. The method of claim 13, further comprising:
storing the first and second calibration tuning values in a memory element; and
during a third time period after the first and second time periods and during which data is received over the frequency channel, compensating for expected distortion by distorting the in-phase receive data and quadrature receive data signals according to the first and second calibration tuning values, respectively corresponding to the frequency channel.

15. The method of claim 12, wherein the calibration method is carried out in a receiver after the receiver has been distributed to a customer.

16. The method of claim 15, wherein the calibration method is carried out during an on-line mode during which the customer is receiving data on the receiver.

17. The method of claim 12, wherein the calibration method is carried out in a receiver in a manufacturing facility before the receiver has been distributed to a customer.

18. The method of claim 17, wherein the calibration mode is carried out during an off-line mode during which no wanted signals are received over the antenna.

19. The method of claim 12, wherein correlation is carried out by using a Normalized Least Mean Squares algorithm.

20. The calibration circuit of claim 1, wherein the first tuning circuit is disposed within a single feedback path that extends from an output node of the correlation element to the in-phase receive data path.

21. The receiver of claim 7, wherein the second tuning circuit is disposed within a single feedback path that extends from an output node of the correlation element to the quadrature receive data path.

* * * * *